United States Patent [19]

Chisholm et al.

[11] Patent Number: 5,221,367
[45] Date of Patent: Jun. 22, 1993

[54] STRAINED DEFECT-FREE EPITAXIAL MISMATCHED HETEROSTRUCTURES AND METHOD OF FABRICATION

[75] Inventors: Matthew F. Chisholm, Oak Ridge, Tenn.; Peter D. Kirchner, Putnam Valley, N.Y.; Alan C. Warren, Peekskill; Jerry M. Woodall, Bedford, N.Y.

[73] Assignee: International Business Machines, Corp., Armonk, N.Y.

[21] Appl. No.: 227,955

[22] Filed: Aug. 3, 1988

[51] Int. Cl.$^5$ .......................................... H01L 21/20
[52] U.S. Cl. ..................................... 148/33; 148/332; 148/334; 148/335; 148/DIG. 72; 148/DIG. 97; 437/108; 437/111
[58] Field of Search ............... 148/DIG. 25, 56, 45, 148/72, 97, 110, 119, 127, 159, 160, 169, 33, 33.2, 33.4, 33.5; 156/610–614; 427/248.1, 255.1; 357/16, 17, 22; 437/81, 105, 107, 108, 111, 126, 129, 133, 936, 945, 969, 976

[56] References Cited

U.S. PATENT DOCUMENTS

| | | | |
|---|---|---|---|
| 3,995,303 | 11/1976 | Nahony et al. | 357/16 |
| 4,075,651 | 2/1978 | James | 357/22 |
| 4,548,658 | 10/1985 | Cook | 437/126 |
| 4,568,958 | 2/1986 | Baliga | 357/23.4 |
| 4,632,712 | 12/1986 | Fan et al. | 437/133 |
| 4,665,415 | 5/1987 | Esaki et al. | 357/22 |
| 4,758,870 | 7/1988 | Hase et al. | 357/16 |
| 4,804,639 | 2/1989 | Yablonovitch | 437/129 |
| 4,807,006 | 2/1989 | Rogers et al. | 357/16 |
| 4,819,039 | 4/1989 | Chi et al. | 357/17 |
| 4,833,101 | 5/1989 | Fujii | 437/133 |
| 4,865,655 | 9/1989 | Fujita et al. | 148/33 |
| 4,889,831 | 12/1989 | Ishii et al. | 437/133 |

FOREIGN PATENT DOCUMENTS

| | | |
|---|---|---|
| 0232082 | 8/1987 | European Pat. Off. |
| 0115380 | 9/1980 | Japan ........................ 437/133 |
| 0072717 | 4/1984 | Japan ........................ 437/133 |
| 0144015 | 7/1986 | Japan ........................ 437/133 |
| 0166124 | 7/1986 | Japan ........................ 437/133 |
| 63-219057 | 8/1987 | Japan . |
| 0208621 | 9/1987 | Japan ........................ 437/133 |

OTHER PUBLICATIONS

Rogers et al., 1987 Device Research Conf., Abs. VI-A-8, Santa Barbara Calif., Jun. 22–24, 1987, pp. 47–49.
H. Munekata et al., Lattice Relaxation of InAs Heteroepitaxy on GaAs, Journal of Crystal Growth 81 (1987) 237–242, North Holland, Amsterdam.
Woodall et al., Proceedings IEEE/Cornell Conference on Advanced Concepts in High Speed Semiconductor Devices and Circuits, Sponsored by IEEE Electron Device Society in Cooperation with IEEE Microwave Theory and Techniques Society and Cornell University, Aug. 10–12, 1987, pp. 3–11.

(List continued on next page.)

Primary Examiner—Robert Kunemund
Attorney, Agent, or Firm—Scully, Scott, Murphy & Presser

[57] ABSTRACT

Heterostructures having a large lattice mismatch between an upper epilayer and a substrate and a method of forming such structures having a thin intermediate layer are disclosed. The strain due to a lattice mismatch between the intermediate layer and the substrate is partially relieved by the formation of edge type dislocations which are localized and photoelectrically inactive. Growth of the intermediate layer is interrupted before it reaches the thickness at which the left over strain is relieved by 60 degree type threading dislocations. The upper epilayer is then grown in an unstrained and defect-free condition upon the intermediate layer where the unstrained lattice constant of the epilayer is about the same as the partially relieved strain lattice constant or the intermediate layer. An unstrained defect-free epilayer of InGaAs has been grown on a GaAs substrate with an intermediate layer 3–10 nm in thickness of InAs. Other large mismatch systems are disclosed, including, GaAs on Si with an intermediate layer of GaInAs.

61 Claims, 3 Drawing Sheets

OTHER PUBLICATIONS

Fang, Low Temperature Epitaxy of (In, Ga) (As, Sb) by Plasma Process, Japanese Publication, Mar. 1987.

Schaffer et al., Nucleation and Strain Relaxation at the InAs/GaAs(100) Heterojunction, J. Vac. Sci. Technol. 8 1(3), Jul.–Sep. 1983.

Lewis et al., RHEED Oscillation Studies of MBE Growth Kinetics and Lattice Mismatch Strain–Induced Effects During InGaAs Growth on GaAs(100), J. Vac. Sci. Technol., 8, vol. 2, No. 3, Jul.–Sep. 1984.

Seki et al., MOCVD Growth of InP on 4–inch Si Substrate with GaAs Intermediate Layer, Japanese Journal of Applied Physics Part 2, 26, Oct. 10, 1987, pp. 1587–1589.

"Heteroepitaxy of GaAs on Si Grown by MOCVD and MBE", Masahiro Akiyama, Abstracts of the 18th (1986 International Conference on Solid State Devices and Materials, Tokyo, 1986, pp. 113–116.

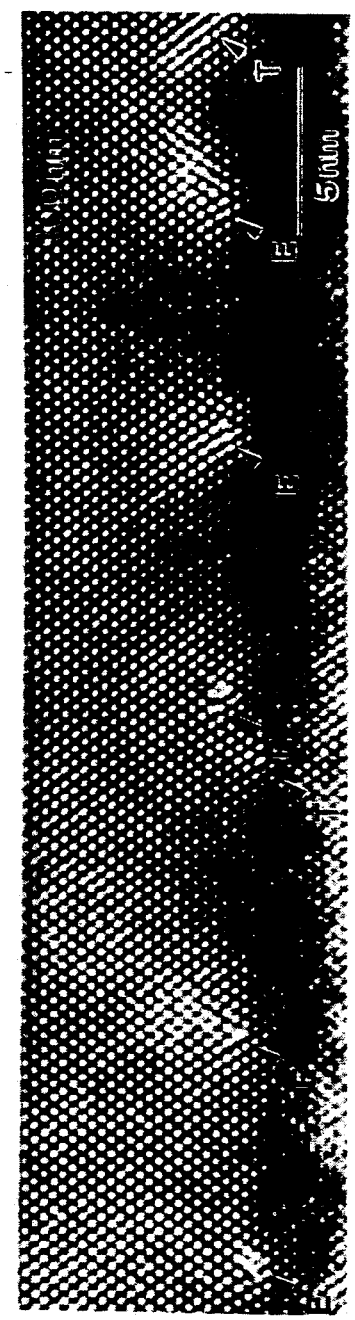
FIG. 2a
FIG. 2b
FIG. 2c

STRAINED DEFECT-FREE EPITAXIAL MISMATCHED HETEROSTRUCTURES AND METHOD OF FABRICATION

FIELD OF THE INVENTION

This invention relates to lattice mismatched heterostructures and to methods for epitaxially growing layers of crystalline materials on a mismatched substrate.

DESCRIPTION OF THE PRIOR ART

Until recently it was very unusual for optoelectronic and high-speed solid state devices to be fabricated with heterojunction structures in which the unstrained lattice constants of the different materials were not approximately equal, and in turn equal to a conveniently available substrate. The lattice matching requirement severely limited the material selection to two principal systems: $Al_xGa_{1-x}As$-GaAs grown on GaAs substrates, and $In_{0.53}Ga_{0.47}As$-$In_{0.52}Al_{0.48}As$ grown on InP substrates.

Unfortunately, optimum material parameters for many devices are obtained with material systems or alloy compositions that are not lattice matched to these or other available bulk substrates. It is highly desirable, therefore, to be able to fabricate devices with layers of an arbitrary lattice constant, upon conveniently available bulk substrates such as GaAs. The use of this approach is contingent upon minimizing the density of defects propagating into the device layers. Recent research has shown the possibility of GaAs devices grown on Si substrates and a possible integration of the two device technologies. There is also interest in the non lattice matched approach for tandem solar cell applications using the GaAs-$In_xGa_{1-x}As$ system.

Even though the potential utility of devices with heterojunctions made from various mismatched systems could be appreciated, the interface between non lattice matched materials has proved to be a source of structural defects with electronic properties which greatly limit that potential utility. The defects include edge and 60 degree misfit dislocations, and 60 degree threading dislocations. The term "misfit dislocation" means a dislocation, or a portion of the dislocation line, that lies parallel to the plane of the substrate, and thus can accommodate part of the lattice mismatch between the substrate and an epitaxial layer. While the term "threading dislocation" strictly refers to dislocations originating from the substrate and propagating into the epitaxial layers above it, colloquially it refers to any dislocations inclined to the plane of the substrate and propagating through the epitaxial layer at some non-normal angle to the growth axis. The term "threading dislocation" will be used in its colloquial sense hereinafter. 60 degree dislocations are introduced by glide, and therefore they can have both threading and misfit segments. Edge dislocations can be formed by the reaction of two 60 degree dislocations, and therefore any unreacted segments can act as 60 degree dislocations. Edge dislocations by themselves are sessile and do not glide. Edge dislocations have been reported (Petroff et al., *J. Micro.* 118,225(1975)) to have little opto-electric activity. Edge dislocations are "composed of" two 60 degree dislocations, and therefore an edge dislocation relieves twice the mismatch compared to a single 60 degree dislocation. Edge dislocations, being less dense for a given relief or misfit, and being sessile, are preferrable to 60 degree dislocations. 60 degree misfit dislocations are electrically active, but because they lie in or near the mismatched interface, they are spatially isolated from successive layers. Various electronic isolation techniques, such as p-n junction isolation, can be used to further reduce their effect.

A common problem in both the GaAs on Si and InGaAs on GaAs systems is the high density of threading dislocations resulting from the accommodations of the large lattice mismatch by plastic deformation. Threading dislocations are known to be associated with radiative recombination, and because the dislocations thread through the device layers this adversely affects the performance of optical and electrical devices fabricated from such systems.

In order to minimize the effect of dislocations, one prior art approach utilizes the pseudomorphic growth of non lattice matched materials. In a system where there is sufficient attraction between the epilayer and the substrate and mismatch is low enough, initial epitaxial growth of a lattice mismatched material upon a substrate occurs two-dimensionally, with the epilayer conforming to the in-plane lattice structure of the substrate and with the mismatch accommodated by elastic strain. This growth is termed commensurate because it is growing with the lattice constant of the substrate, rather than the unstrained bulk lattice constant of the epitaxial layer material. The commensurate growth is pseudomorphic as long as the layer thickness is below a critical thickness (which for a mismatch of about 1-5% is about 1-100 nm) which defines the strain energy for which the introduction of dislocations becomes energetically favored. Many lattice mismatched devices have been made in which the strained layer thickness is kept below the critical thickness. However, many electronic or optoelectronic devices require non lattice matched layers with thicknesses exceeding the limits of pseudomorphism, or with too much mismatch for the attraction between the film and the substrate to allow 2-dimensional nucleation.

A second prior art approach to fabricating heterojunctions of lattice mismatched materials utilizes a strained layer superlattice technique in which layers are alternately placed under compressive and tensile strain, but in which the average lattice constant is matched to the substrate. While the superlattice can be nearly free of misfit dislocations, the material selection is still limited by the need to match the average lattice constant of the superlattice to the substrate, the need to keep the individual layer's thicknesses below their critical thicknesses, and the need to restrict mismatch to maintain 2-D growth.

In yet another prior art approach, the desired lattice constant can be obtained by compositional step-grading, by growing several layers above their critical thicknesses, limiting the change in lattice constant at each interface to less than about 1.5% (within the InGaAs system). The grading from the lattice constant of the substrate material to the lattice constant of the final layer is in steps that are small enough to allow reliable 2-dimensional growth throughout the growth process. The drawback of this technique is that the multilayer combination contains enough total strain energy to introduce additional misfit and threading dislocations, with only kinetic limitations to their eventual introduction. Thus the structure contains a significant number of undesired threading dislocations, and is predisposed to the addition of more over time, causing degraded electrical and optical properties and unreliable operation. The defects so formed are photo-electrically active and are also strong scatterers so that the transition material must be separated from active regions of the subsequent heterostructure by large buffer layers and/or drift fields.

SUMMARY OF THE INVENTION

The present invention is directed to heterojunction structures and to a method for making heterojunctions between various materials of interest which have a large mismatch in their unstrained bulk lattice constants. This is accomplished by interposing a thin intermediate layer between a substrate of a first semiconductor material and an epitaxially grown upper layer of a second semiconductor material having mismatched lattice constants. The intermediate layer is comprised of a third semiconductor material having an unstrained or bulk lattice constant with a greater mismatch with the bulk lattice constant of the substrate than the mismatch between the substrate and the upper layer. It is known that for large mismatches, there will be a growth period in which the layer is growing with a partially relaxed lattice constant. The amount of mismatch necessary that will result in the partially relaxed lattice constant is system and growth dependent. For the InGaAs system, the inventors have determined that the mismatch must be about 2.5% or greater. The inventors have also determined that during this growth period, the strain is partially relieved substantially due to a planar array of edge type dislocations introduced during a short period of growth when the film becomes 3-dimensional. The array is complete enough that a minimum of threading dislocations are created when the layer coalesces back to two dimensions upon this partial relief of strain and a minimum of additional growth. In accordance with the inventive method, the growth of the intermediate layer is stopped while the layer is growing in an essentially 2-dimensional mode with the strain partially relieved by the edge type dislocations. The growth of the intermediate layer is interrupted before the layer reaches a second critical thickness determined by the residual strain, in which the strain would be further relieved by 60 degree misfit dislocations with threading segments. Epitaxial growth of the upper layer upon the intermediate layer is then commenced. The bulk lattice constant of the upper layer is approximately equal to the partially relaxed in-plane lattice constant of the intermediate layer. Therefore, the upper layer is unstrained, and it is stable against the introduction of additional defects, as if grown on a lattice-matched substrate.

It is important that growth of the intermediate layer has not been thick enough for the formation of significant numbers of the photoelectrically active threading dislocations. The planar array of edge type dislocations is localized near the interface and unable to migrate into the epilayer, and thus should cause no effect on the properties of the adjacent layers. Thus, the necessity of including large buffer layers or drift fields within the heterostructure in order to separate active areas from the plastically deformed region is potentially eliminated by the present invention.

In one embodiment of the invention, molecular beam epitaxy (MBE) is used to grow an epilayer of $In_{0.72}Ga_{0.28}As$ in an unstrained, low-defect condition upon a substrate of GaAs using an $In_{0.9}Ga_{0.1}As$ intermediate layer. The intermediate layer of $In_{0.9}Ga_{0.1}As$ is between 3–10 nm thick. During this range of thickness under common arsenic-stabilized growth conditions, approximately 80% of the mismatch in the lattice constants is accommodated by the planar array of edge dislocations that forms at the $In_{0.9}Ga_{0.1}As$-GaAs interface. Photoelectrically active threading dislocations have not formed in large numbers. Consequently, the epilayer of $In_{0.72}Ga_{0.28}As$, which has a bulk lattice constant approximately equal to that of the 80% relaxed $In_{0.9}Ga_{0.1}As$ was grown unstrained and relatively defect-free. If the density of threading dislocations is too high for a specific application, there are "strained layer superlattice" techniques reported in the literature that are shown to be effective on small densities of threading dislocations. Large densities of threading dislocations that result from prior art methods for accommodating misfit cannot be practically treated by the "strained layer superlattice" dislocation filter technique because of the limited number of threading dislocations that can be "bent out" of the crystal at each interface.

In another embodiment of the invention, two intermediate layers are grown. In this embodiment, MBE is used to grow the $In_{0.9}Ga_{0.1}As$ intermediate layer about 10 nm thick, where it has relaxed about 80% of its original 6.3% misfit by incorporating edge dislocations at or near its interface with the GaAs substrate during a 3-dimensional phase in its growth. Having coalesced into a continuous and substantially 2-dimensional film by 10 nm thickness, the layer has not exceeded the critical thickness (for the residual 1.3% lattice mismatch) needed to produce additional 60 degree misfit dislocations by glide. The in-plane lattice constant is approximately that of unstrained $In_{0.72}Ga_{0.28}As$. To further insure against the effects of strain arising from mismatch due to experimental variables, the residual compressive strain in the $In_{0.9}Ga_{0.1}As$ can be offset by growing 20 nm of $In_{0.63}Ga_{0.37}As$, which when grown with an in-plane lattice constant of $In_{0.72}Ga_{0.28}As$, has a net tensile strain that balances the net residual compressive strain energy in the 10 nm $In_{0.9}Ga_{0.1}As$ layer. The Upper $In_{0.72}Ga_{0.28}As$ layer can then be grown arbitrarily thick, nearly defect-free and unstrained, atop this substrate-double intermediate layer combination that contains little if any net strain energy. This transformation of lattice constant has been accomplished within 30 nm of growth, taking about 2 minutes at convention MBE growth rates.

The heterojunction structures of the invention have epitaxial layers grown on a mismatched substrate without large densities of propagating (inclined) photoelectrically active crystal defects. Thus, a new array of optoelectronic devices may now be fabricated using highly desirable material systems that are not lattice matched to suitable substrates. These systems include InGaAs on GaAs, Ge-Si alloys on Si, and GaAs or InGaAs on Si.

BRIEF DESCRIPTION OF THE DRAWINGS

FIGS. 2(a)–2(c) are TEM pictures of the growth of InAs on GaAs at various thicknesses.

DETAILED DESCRIPTION OF THE PREFERRED EMBODIMENTS

In accordance with the present invention, heterostructures comprising unstrained, essentially defect-free epilayers of a first semiconductor material are grown on substrates of a second semiconductor material, in which there is a large difference between the unstrained lattice constants of the materials. This is accomplished with only a thin intermediate layer of a third semiconductor material sandwiched between the substrate and the upper epilayer. The unique method of fabricating the heterostructures of the invention is based, in part, on the nature of strained layer growth and its relaxation behavior. The relaxation of strain during the growth of large-mismatch layers is illustrated in a paper by Munekata, et al., (Lattice Relaxation of InAs Heteroepitaxy on GaAs, Journal of Crystal Growth 81, 237–242 (1987). Munekata, et al., details the growth by MBE of InAs on GaAs for a variety of growth conditions. It is shown therein that growth of the InAs epilayer upon the GaAs substrate first occurs pseudomorphically with the in-plane lattice constant of the strained layer matching that of the substrate. Thereafter, as the growth continues, a gradual lattice relaxation of the InAs occurs to accommodate the mismatch until 100% relaxation is reached.

The inventors have determined for a large mismatch of the unstrained lattice constants, that after the initial planar pseudomorphic growth, the layer collapses into 3-dimensional island growth. During this 3-D growth, a large fraction of the strain is abruptly relieved by the introduction of a planar array of edge type dislocations. For the InGaAs/GaAs interface this occurs after about 1-2 nm of growth. As growth continues to a thickness of about 10-20 nm, the growth again becomes planar. The array of edge type dislocations is complete enough that a minimum of threading dislocations are created when the layer coalesces back to two dimensions. Growth during this partial relaxation period, from 1-2 nm to 10-20 nm, under proper conditions of flux and temperature, proceeds with a partially relaxed lattice constant which, for InGaAs/GaAs is about 80% relaxed. As growth proceeds beyond this point, enough strain energy is built in to induce the formation of 60 degree dislocations which propogate into the layer and gradually relax the material to unstrained.

Figure 1:
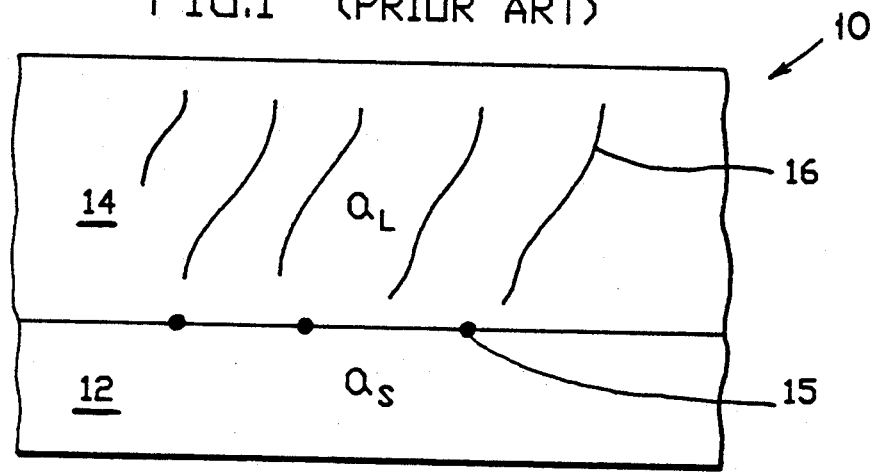
FIG. 1 is a cross-sectional view of a prior art heterostructure of an epilayer on a substrate with large mismatch and the resulting propagating defects.

FIG. 1 shows a cross-sectional view of a prior art heterojunction structure 10 that results from the conventional growth of large mismatched materials. Heterostructure 10 comprises a substrate 12 of one semiconductor material with unstrained lattice constant $a_S$, and an epitaxially grown layer 14 of a different semiconductor material with an unstrained lattice constant $a_L$. The percent lattice mismatch, $\epsilon_{L-S}$, that is due to the difference between the unstrained lattice constants of the substrate and the upper layer, can be expressed as:

$$\frac{\Delta a_{L-S}}{a_S} \times 100 = \epsilon_{L-S}, \quad (1)$$

where $\Delta a_{L-S}$ is the absolute value of $a_L - a_S$.

The absolute value of the difference is used in equation (1) since for various materials used for layer 14 can have a bulk lattice constant either larger or smaller than $a_L$. For an $\epsilon_{L-S}$ of 2.5% or greater, as shown in FIG. 1, the growth of layer 14 to a thickness sufficient to allow 100% relaxation, results in the formation of both edge type misfit dislocations 15 and a high density of photoelectrically active threading dislocations 16. These defects make the heterojunction structure of FIG. 1 ineffective for many optoelectronic applications.

In the method according to the present invention, the intermediate layer is formed by interrupting the growth of that layer while it is growing with the partially relaxed in-plane lattice constant. The inventors have determined that during the partial relaxation growth period, the strain is partially relieved substantially by a planar array of edge type dislocations without a significant number of threading dislocations. At this point, the growth of the upper epilayer is commenced. The upper epilayer has a bulk lattice constant approximately equal to the partially relaxed in-plane lattice constant of the intermediate layer and therefore, the upper epilayer will grow unstrained and defect free. The upper epilayer is lattice matched to the in-plane lattice constant of the partially relaxed intermediate layer but is mismatched with the substrate. Thus, the present invention provides a heterostructure having an epilayer with a large lattice mismatch with respect to the substrate that includes only a thin intermediate layer.

FIGS. 2(a), 2(b) and 2(c) are TEM pictures of the growth to InGaAs on GaAs at various thicknesses. FIG. 2(a) is after approximately 1 nm of growth which shows the growth as being essentially planar and pseudomorphic. FIG. 2(b) shows the 3D island growth after approximately 5 nm. The presence of a small number of edge type dislocations are indicated by the letter E. FIG. 2(c) is after 10 nm of growth showing that the growth has returned to planar. Substantially all of the defects are edge type dislocations with only one threading dislocation indicated by the letter T. The density of photoelectrically active threading dislocations is therefore very small during the partial relaxation growth period. Thus, the strain in the intermediate layer is partially relieved during this growth period substantially by a planar array of edge type dislocations.

Figure 3:
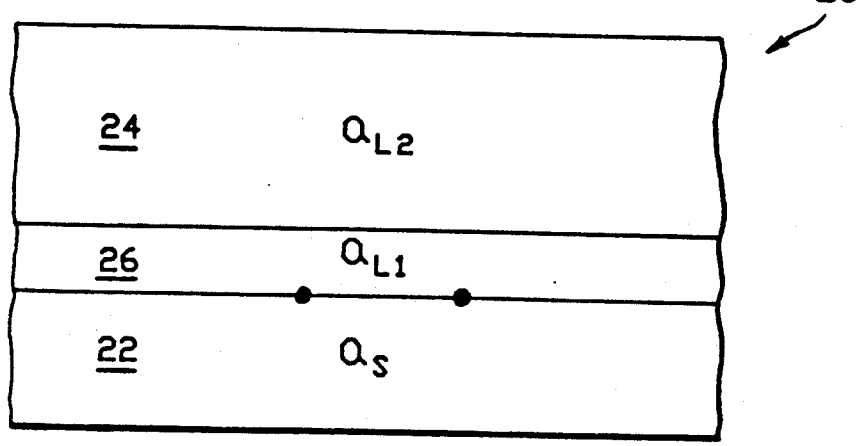
FIG. 3 is a cross-sectional view of one embodiment of a heterostructure of the present invention in which the propagating defects have been avoided.

As shown in FIG. 3, a heterostructure 20 of the invention includes a substrate 22 of a first semiconductor material with a bulk lattice constant $a_S$. The heterostructure 20 also includes an upper epitaxially grown layer 24 of a second semiconductor material with a bulk lattice constant $a_{L2}$. Interposed between layers 24 and 22 is an epitaxially grown layer 26 of a third semiconductor material. The intermediate layer 26 has a bulk lattice constant $a_L$.

As stated above, the epitaxial growth of layer 26 begins pseudomorphically and strained to the lattice constant of the substrate, $a_S$. After growth reaches the first critical thickness, the strain becomes partially relieved by the edge type dislocations and layer 26 then grows with a partially relaxed in-plane lattice constant, $a_{L1}$. The layer 26 continues to grow with the partially relaxed in-plane lattice constant for a predetermined thickness depending on growth conditions and the material used. The growth of layer 26 is halted while it is growing at the $a_{L1}$ lattice constant. The percentage mismatch, therefore, between layers 26 and 22 is defined as:

$$\epsilon_{L1-S} = \frac{\Delta a_{L1-S}}{a_S} \times 100, \quad (2)$$

where $\Delta a_{L1-S}$ = absolute value of $a_{L1} - a_S$.

The bulk lattice mismatch between layers 26 and 22 for the InGaAs/GaAs system, defined by $\epsilon_{L-S}$, should be greater than the 2.5% and typically will be in the range 3% to 7.5%. The strain, at the time growth is interrupted for InAs is approximately 80% relieved, and therefore, the $\epsilon_{L1-S}$ for structure 20 will be approximately 80% of $\epsilon_{L-S}$. The partial relaxation value, or in other words, the residual percent strain, $\epsilon_{L1}$, is defined as:

$$\epsilon_{L1} = \frac{\Delta a_L}{a_L} \times 100, \quad (3)$$

where $\Delta a_L$ is equal to the absolute value of $a_{L1} - a_L$.

The partial relaxation value, $\epsilon_{L1}$, for the InGaAs 80% relaxed in-plane lattice constant is approximately 1-2%. The materials are selected for layers 24 and 26 so that the bulk lattice constant of layer 24, $a_{L2}$, is approximately equal to the partially relaxed lattice constant of layer 24, $a_{L1}$. Thus, layer 26 grows lattice matched with layer 26 and is therefore, unstrained and defect free.

The absolute values are used in the above definition of $\epsilon_{L1-S}$ because the lattice constant $a_{L1}$ can be either larger or smaller than $a_S$. The only requirement is that the bulk unstrained lattice constant of layer 26, $a_L$, be at least 2.5% different than $a_S$. The partially relaxed lattice constant of layer 26, $a_{L1}$, will always be between the $a_L$ and $a_S$ values, whether $a_L$ is larger or smaller than $a_S$. In addition, the thickness of layer 26 must be less than the second critical thickness, which is the thickness above which the left over strain is relieved by 60 degree type threading dislocations. For the growth of InGaAs on a GaAs substrate, the thickness at which InGaAs is growing with the 80% relaxed in-plane lattice constant is between 3 and 10 nm.

Through the practice of this invention, a layer of $In_{0.72}Ga_{0.28}As$ has been epitaxially grown by MBE on a GaAS substrate through the inclusion of an intermediate layer of $In_{0.9}Ga_{0.1}As$ of less than 10 nm in thickness. The $In_{0.9}Ga_{0.1}As$ layer contained the stabilized and localized damage necessary to relieve the strain in the system. Moreover, the damage consists primarily of defects confined to the interface plane which cause little or no effect on the optical properties or mobility in adjacent layers. Therefore, it is not necessary to include large buffer layers or drift fields within the heterostructure to separate the active carriers from the damaged region.

Other examples of systems with a large mismatch of the unstrained lattice constants to which the concept of this invention can be applied to substantially reduce the effects of strain defects include a GaInAs intermediate layer on a Si substrate, and in which the upper epilayer may be either GaAs or GaAlAs. In both of these systems, the GaInAs composition must contain at least 15-20% In, to ensure sufficient $\epsilon_{L-S}$.

Another system comprises an intermediate layer of GaInAs upon a substrate of GaAs. The upper epilayer may also comprise GaInAs, as long as the In concentration in the intermediate layer is greater than in the upper layer. AlInAs can also be used as an upper epilayer on the GaInAs/GaAs substrate ensemble.

In yet another system, an intermediate layer of AlInAs upon a substrate of GaAs is used. The upper epilayer may comprise AlInAs as long as the In concentration in the intermediate layer is greater than in the upper layer. GaInAs can also be used as an upper epilayer on the AlInAs/GaAs substrate ensemble.

A further system comprises a layer of InAs interposed between a GaAs substrate and an upper layer of $In_{0.8}Ga_{0.2}As$. As shown in Munekata, et al. cited above, a gradual relaxation of InAs on GaAs occurred on a GaAs substrate having a (100) crystallographic configuration. In addition, of the three growth conditions studied by Munekata et al.; low growth temperature and high $As_4/In$ ratio; medium temperature and ratio; and high temperature and low ratio, it appears that for InAs on GaAs, high growth temperature and low $As_4/In$ ratio may be the preferred conditions for growing the intermediate layer of the invention. It is known that such conditions provide better surface diffusion and high mobility which also is desirable.

Figure 4:
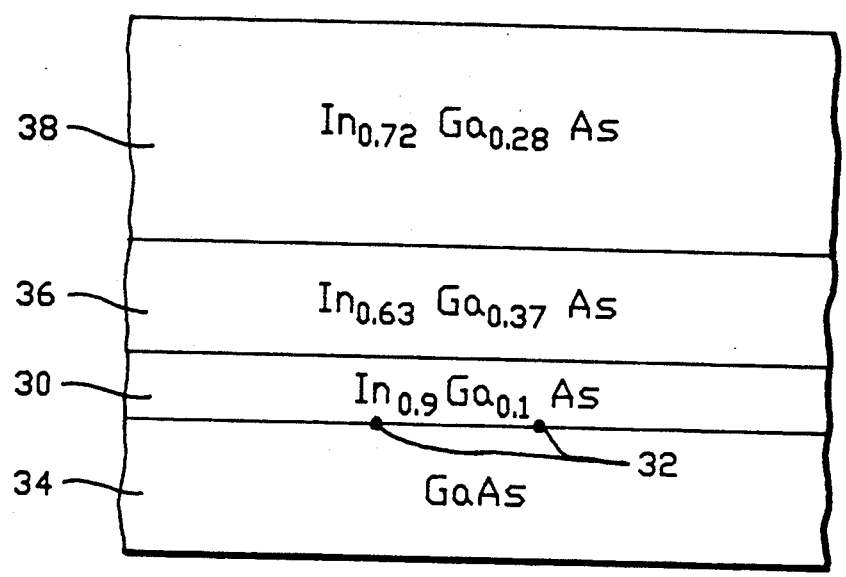
FIG. 4 is a cross-sectional view of another embodiment of a heterostructure of the present invention, having two intermediate layers.

In another embodiment of the invention, two intermediate layers are grown. In this embodiment, as shown in FIG. 4, MBE is used to grow an $In_{0.9}Ga_{0.1}As$ intermediate layer 30 about 10 nm thick, where it has relaxed about 80% of its original 6.3% misfit by incorporating edge dislocations 32 at or near its interface with a GaAs substrate 34 during a 3-dimensional phase in its growth. The $In_{0.9}Ga_{0.1}As$ layer coalesces into a continuous and substantially 2-dimensional film by 10 nm thickness, and has not exceeded the critical thickness (for the residual 1.3% lattice mismatch) needed to produce additional 60 degree misfit dislocations by glide. At this point, the in-plane lattice constant is approximately that of unstrained $In_{0.72}Ga_{0.28}As$. To further insure against the effects of strain arising from mismatch cue to experimental variables, the residual compressive strain in the $In_{0.9}Ga_{0.1}As$ can be offset by growing a layer 36 of 20 nm of $In_{0.63}Ga_{0.37}As$, which when grown with an in-plane lattice constant of $In_{0.72}Ga_{0.28}As$, has a net tensile strain that balances the net residual compressive strain energy in the 10 nm $In_{0.9}Ga_{0.1}As$ layer 30. An upper $In_{0.72}Ga_{0.28}As$ layer 38 can then be grown arbitrarily thick, nearly defect-free and unstrained, atop this substrate-double intermediate layer combination that contains little if any net strain energy. This transformation of lattice constant has been accomplished with 30 nm of growth, taking about 2 minutes at convenient MBE growth rates.

While the invention has been particularly shown and described with respect to preferred embodiments thereof, it will be understood by those skilled in the art that the foregoing and other changes in form and details may be made therein without departing from the spirit and scope of the invention, which should be limited only by the scope of the appended claims

What is claimed is:

1. A single crystal heterostructure comprising:
    a substrate of a first semiconductor material having a crystalline structure and a first bulk lattice constant;
    an upper layer of a second epitaxially grown semiconductor material which is unstrained having a second bulk lattice constant different from said first bulk lattice constant; and
    an intermediate layer of a third epitaxially grown semiconductor material sandwiched between said substrate and said upper layer of a second semiconductor material having a partial strain therein due to its growth on said substrate and a partially relaxed in-plane lattice constant substantially equal to the second bulk lattice constant.

2. The heterostructure of claim 1 wherein the intermediate layer of a third semiconductor material has a bulk lattice constant sufficiently different from the bulk lattice constant of the first semiconductor material such that a percentage mismatch between said first semiconductor material and said intermediate layer of third semiconductor material is at least 2.5%.

3. The heterostructure of claim 1 wherein the strain of the third semiconductor material is partially relieved substantially by a planar array of edge type dislocations at the interface between the first and third semiconductor materials.

4. The heterostructure of claim 1 wherein the first semiconductor material is GaAs.

5. The heterostructure of claim 4 wherein the intermediate layer of third semiconductor material is $In_{0.9}Ga_{0.1}As$.

6. The heterostructure of claim 5 wherein the partially relaxed in-plane lattice constant is about 80% relaxed.

7. The heterostructure of claim 5 wherein the upper layer of second semiconductor material is $In_{0.72}Ga_{0.28}As$.

8. The heterostructure of claim 4 wherein GaAs has a (100) crystallographic configuration.

9. The heterostructure of claim 5 wherein the intermediate layer of third semiconductor material is between 3–10 nm thick.

10. The heterostructure of claim 4 wherein the layer of a third semiconductor material is GaInAs and the second semiconductor material is AlInAs.

11. The heterostructure of claim 4 wherein the layer of a third semiconductor material is AlInAs and the second semiconductor material is GaInAs.

12. The heterostructure of claim 4 wherein the second and third semiconductor materials are comprised of AlInAs, with the In concentration in the third semiconductor material being greater than the In concentration in the second semiconductor material.

13. The heterostructure of claim 4 wherein the second and third semiconductor materials are comprised of GaInAs, with the In concentration in the third semiconductor material being greater than the In concentration in the second semiconductor material.

14. The heterostructure of claim 4 wherein the second semiconductor material is InGaAs and the third semiconductor material is InAs.

15. The heterostructure of claim 14 wherein the second semiconductor material is $In_{0.8}Ga_{0.2}As$.

16. The heterostructure of claim 1 wherein the thickness of the intermediate layer of third semiconductor material is less than the thickness at which the partial strain is further relieved by 60 degree type threading dislocations.

17. The heterostructure of claim 2 wherein the percentage mismatch between said first semiconductor material and said third semiconductor material is between 3 and 7.5%.

18. The heterostructure of claim 1 wherein the first semiconductor material is Si.

19. The heterostructure of claim 18 wherein the third semiconductor material is GaInAs.

20. The heterostructure of claim 19 wherein the second semiconductor material is GaAs.

21. The heterostructure of claim 19 wherein the second semiconductor material is GaAlAs.

22. The heterostructure of claim 19 wherein the GaInAs material is comprised of 15–20% In.

23. The heterostructure of claim 1 further including a second intermediate layer of a fourth semiconductor material sandwiched between said upper layer of second semiconductor material and said intermediate layer of third semiconductor material, said second intermediate layer of fourth semiconductor material having a partial strain therein due to its growth on said third semiconductor material and a partially relaxed in-plane lattice constant substantially equal to the second bulk lattice constant.

24. The heterostructure of claim 23 wherein the second intermediate layer of fourth semiconductor material comprises $In_{0.63}Ga_{0.37}As$, said intermediate layer of third semiconductor material comprises $In_{0.9}Ga_{0.1}As$, said upper layer of second semiconductor material comprises $In_{0.72}Ga_{0.28}As$ and said substrate comprises GaAs.

25. The heterostructure of claim 24 wherein the intermediate layer of third semiconductor material is about 10 nm thick and the second intermediate layer of fourth semiconductor material is about 20 nm thick.

26. A method of providing a strain free semiconductor layer comprising the steps of:
   providing a substrate of a first semiconductor material having a crystalline structure and a first bulk lattice constant;
   epitaxially growing an intermediate layer of a second semiconductor material on said substrate having a second bulk lattice constant different from said first bulk lattice constant and having a partial strain therein due to its growth on said substrate and a partially relaxed in-plane lattice constant; and
   epitaxially growing an upper layer of a third semiconductor material which is unstrained having a lattice constant substantially equal to said partially relaxed in-plane strain lattice constant.

27. The method of claim 26 wherein the intermediate layer has a bulk lattice constant sufficiently different from the bulk lattice constant of the substrate such that a percentage mismatch between said substrate and intermediate layer is at least 2.5%.

28. The method of claim 26 wherein the strain of the intermediate layer is partially relieved substantially by a planar array of edge type dislocations at the interface between said substrate layer and said intermediate layer.

29. The method of claim 26 wherein the substrate comprises GaAs.

30. The method of claim 29 wherein the intermediate layer comprises InAs.

31. The method of claim 30 wherein the partially relaxed in-plane lattice constant is about 80% relaxed.

32. The method of claim 30 wherein the thickness of the intermediate layer is between 3–10 nm.

33. The method of claim 30 wherein the upper layer comprises InGaAs.

34. The method of claim 29 wherein the intermediate layer comprises one of GaInAs and AlInAs.

35. The method of claim 34 where the upper layer comprises one of GaInAs and AlInAs, and wherein the In concentration in the intermediate layer is greater than the In concentration in the upper layer.

36. The method of claim 26 wherein the substrate comprises Si.

37. The method of claim 36 wherein the intermediate layer comprises GaInAs.

38. The method of claim 37 wherein the upper layer comprises one of GaAs and GaAlAs.

39. The method of claim 37 wherein the intermediate layer comprises 15–20% In.

40. The method of claim 29 wherein the GaAs substrate has a (100) crystallographic configuration.

41. The method of claim 35 wherein the intermediate layer comprises $In_{0.9}Ga_{0.1}As$ and the upper layer comprises $In_{0.72}Ga_{0.28}As$.

42. The method of claim 30 further including the step of epitaxially growing a second intermediate layer of a fourth semiconductor material on said intermediate layer of a second semiconductor material having a partial strain therein due to its growth on said layer of second semiconductor material and a partially relaxed in-plane lattice constant.

43. The method of claim 42 wherein the first semiconductor material comprises GaAs, the second semiconductor material comprises $In_{0.9}Ga_{0.1}As$, the third semiconductor material comprises $In_{0.72}Ga_{0.28}As$ and the fourth semiconductor material comprises $In_{0.63}Ga_{0.28}As$.

44. A method for providing a strain free semiconductor layer comprising the steps of:
 epitaxially growing an intermediate layer of a first semiconductor material on a substrate of a second semiconductor material;
 interrupting the growing of said intermediate layer at a point wherein the strain lattice constant is partially relaxed; and
 epitaxially growing an upper layer of a third semiconductor material on said intermediate layer which is unstrained and defect free.

45. The method of claim 44 wherein the substrate and intermediate layers have mismatched bulk lattice constants wherein the percentage mismatch is at least 2.5%.

46. The method of claim 45 wherein the bulk lattice constant of the upper layer is substantially equal to said partially relieved strain lattice constant of the intermediate layer.

47. The method of claim 44 wherein the substrate comprises GaAs.

48. The method of claim 47 wherein the intermediate layer comprises InAs.

49. The method of claim 48 wherein the partially relieved strain lattice constant is about 80% relieved.

50. The method of claim 48 wherein the thickness of the intermediate layer is between 3-10 nm.

51. The method of claim 48 wherein the upper layer comprises InGaAs.

52. The method of claim 47 wherein the intermediate layer comprises one of InAs, GaInAs and AlInAs.

53. The method of claim 52 wherein the upper layer comprises one of GaInAs and AlInAs and wherein the In concentration is greater in the intermediate layer than in the upper layer.

54. The method of claim 44 wherein the substrate comprises Si.

55. The method of claim 54 wherein the intermediate layer comprises GaInAs.

56. The method of claim 55 wherein the upper layer comprises one of GaAs and GaAlAs.

57. The method of claim 56 wherein the intermediate layer comprises 15-20% In.

58. The method of claim 47 wherein the GaAs substrate has a (100) crystallographic configuration.

59. The method of claim 53 wherein the intermediate layer comprises $In_{0.9}Ga_{0.1}As$ and the upper layer comprises $In_{0.72}Ga_{0.28}As$.

60. The method of claim 41 further including the step of epitaxially growing a second intermediate layer of a fourth semiconductor material on said intermediate layer of a second semiconductor material having a partial strain therein due to its growth on said layer of second semiconductor material and a partially relaxed in-plane lattice constant.

61. The method of claim 60 wherein the first semiconductor material comprises GaAs, the second semiconductor material comprises $In_{0.9}Ga_{0.1}As$, the third semiconductor material comprises $In_{0.72}Ga_{0.28}As$ and the fourth semiconductor material comprises $In_{0.63}Ga_{0.28}As$.

* * * * *

UNITED STATES PATENT AND TRADEMARK OFFICE
CERTIFICATE OF CORRECTION

PATENT NO.    : 5,221,367
DATED         : June 22, 1993
INVENTOR(S)   : Matthew P. Chisolm, et al.

It is certified that error appears in the above-indentified patent and that said Letters Patent is hereby corrected as shown below:

On the Title Page, Section [54]: "STRAINED" should read --UNSTRAINED--

Column 1, line 20:  "AsIn"  should read --As-In--
Column 7, line 18:  "24,"   should read as --26,--
Column 7, line 18:  "26"    should read as --24--
Column 8, line 28, "cue" should read --due--

Signed and Sealed this

Third Day of May, 1994

Attest:

BRUCE LEHMAN

*Attesting Officer*          *Commissioner of Patents and Trademarks*